(12) United States Patent
Imai et al.

(10) Patent No.: US 11,984,437 B2
(45) Date of Patent: May 14, 2024

(54) LIGHT-EMITTING DEVICE

(71) Applicant: NICHIA CORPORATION, Anan (JP)

(72) Inventors: Takeshi Imai, Anan (JP); Masatoshi Nakagaki, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 336 days.

(21) Appl. No.: 17/489,676

(22) Filed: Sep. 29, 2021

(65) Prior Publication Data

US 2022/0102332 A1 Mar. 31, 2022

(30) Foreign Application Priority Data

Sep. 30, 2020 (JP) .................................. 2020-166497
Aug. 20, 2021 (JP) .................................. 2021-135011

(51) Int. Cl.
*H01L 25/16* (2023.01)
*H01L 23/00* (2006.01)
*H01L 33/62* (2010.01)

(52) U.S. Cl.
CPC .......... *H01L 25/167* (2013.01); *H01L 25/162* (2013.01); *H01L 33/62* (2013.01); *H01L 24/48* (2013.01); *H01L 24/49* (2013.01); *H01L 2224/48155* (2013.01); *H01L 2224/49175* (2013.01); *H01L 2924/10253* (2013.01);
(Continued)

(58) Field of Classification Search
CPC ..... H01L 25/167; H01L 25/162; H01L 33/62; H01L 24/48; H01L 24/49; H01L 2224/48155; H01L 2224/49175; H01L 2924/10253; H01L 2924/12035; H01L 2924/12041; H01L 24/06; H01L 2224/0603; H01L 2224/48137; H01L 2224/48247; H01L 2224/49111; H01L 2924/00014; H01L 2924/19107; H01L 25/0753; H01S 5/4031; H01S 5/405; H01S 5/02253; H01S 5/0239; H01S 5/4018;
(Continued)

(56) References Cited

U.S. PATENT DOCUMENTS 7,130,323 B2 10/2006 Tsunekane
8,704,085 B2 4/2014 Lockenhoff
(Continued)

FOREIGN PATENT DOCUMENTS

CN 203589024 U 5/2014
JP 2002-299695 A 10/2002
(Continued)

*Primary Examiner* — Robert G Bachner
(74) *Attorney, Agent, or Firm* — Global IP Counselors, LLP

(57) ABSTRACT

A light-emitting device includes first and second light-emitting elements, first and second support members bonded to the first and second light-emitting elements, respectively, first and second protective elements, and a plurality of wirings including: a first wiring with one end being bonded to the first light-emitting element or the first support member; a second wiring with one end being bonded to the first light-emitting element or the first support member and the other end being bonded to the second light-emitting element or the second support member; a third wiring with one end being bonded to the first protective element or a support member equipped with the first protective element; and a fourth wiring with one end being bonded to the second protective element or a support member equipped with the second protective element.

17 Claims, 9 Drawing Sheets

(52) U.S. Cl.
CPC ............. *H01L 2924/12035* (2013.01); *H01L 2924/12041* (2013.01)

(58) Field of Classification Search
CPC ............ H01S 5/02216; H01S 5/02255; H01S 5/02257; H01S 5/02345; H01S 5/06825
See application file for complete search history.

(56) References Cited

U.S. PATENT DOCUMENTS

| | | |
|---|---|---|
| 10,468,317 B2 | 11/2019 | Schwarz et al. |
| 2016/0233201 A1 | 8/2016 | Sakai |
| 2019/0035702 A1 | 1/2019 | Schwarz et al. |
| 2020/0036158 A1 | 1/2020 | Miyata et al. |
| 2020/0194974 A1 | 6/2020 | Kozuru et al. |
| 2020/0303609 A1 | 9/2020 | Yoon |

FOREIGN PATENT DOCUMENTS

| | | |
|---|---|---|
| JP | 2010-020962 A | 1/2010 |
| JP | 2010-123768 A | 6/2010 |
| JP | 2018-093192 A | 6/2018 |
| JP | 2019-047117 A | 3/2019 |
| JP | 2020-021761 A | 2/2020 |
| JP | 2020-068312 A | 4/2020 |
| JP | 2020-095939 A | 6/2020 |
| WO | 2015/060278 A1 | 4/2015 |

← I

LIGHT-EMITTING DEVICE

CROSS-REFERENCE TO RELATED APPLICATION

This application claims priority to Japanese Patent Application No. 2020-166497, filed on Sep. 30, 2020, and Japanese Patent Application No. 2021-135011, filed on Aug. 20, 2021, the disclosures of which are hereby incorporated by reference in their entireties.

BACKGROUND

The present disclosure relates to a light-emitting device.

Japanese Patent Publication No. 2020-21761 discloses a light-emitting device including a plurality of light-emitting elements connected in series and driven by a constant current, and Zener diodes connected to the light-emitting elements in parallel, the Zener diodes being used for a bypass current path at the time of open-mode failure.

SUMMARY

However, Japanese Patent Publication No. 2020-21761 does not disclose a concrete form of connections between a plurality of light-emitting elements by wiring. Accordingly, there is room for improvement in the connection form of wiring in the case in which wiring is used.

A light-emitting device disclosed in an embodiment includes a plurality of light-emitting elements, a plurality of support members, a first protective element, a second protective element, a first wiring, a second wiring, a third wiring and a fourth wiring. The light-emitting elements each having a p-electrode and an n-electrode. The light-emitting elements including a first light-emitting element and a second light-emitting element. The support members including a first support member bonded with the first light-emitting element and a second support member bonded with the second light-emitting element. The first protective element is configured to protect the first light-emitting element. The second protective element is configured to protect the second light-emitting elements. One of ends of the first wiring is bonded to the first light-emitting element or the first support member. One of ends of the second wiring is bonded to the first light-emitting element or the first support member, and the other of the ends of the second wiring is bonded to the second light-emitting element or the second support member. One of ends of the third wiring is bonded to the first protective element or a support member equipped with the first protective element. One of ends of the fourth wiring is bonded to the second protective element or a support member equipped with the second protective element. A current passes from the n-electrode of the first light-emitting element to the p-electrode of the second light-emitting element through a first current path running through the first wiring and the second wiring. A current passes from the first protective element to the p-electrode of the second light-emitting element through a second current path running through the third wiring. A current passes from the first protective element to the second protective element through a third current path running through the third wiring and the fourth wiring but not through the first wiring or the second wiring.

A light-emitting device disclosed in an embodiment includes a plurality of light-emitting elements, a plurality of support members, a first protective element, a second protective element, a first wiring, a second wiring, a third wiring and a fourth wiring. The plurality of light-emitting elements each has a first surface and a second surface opposite to the first surface. The plurality of light-emitting elements includes a first light-emitting element and a second light-emitting element. The plurality of support members including a first support member bonded with the first surface of the first light-emitting element and a second support member bonded with the first surface of the second light-emitting element. The first protective element is configured to protect the first light-emitting element. The second protective element is configured to protect the second light-emitting element. One of ends of the first wiring is bonded to the second surface of the first light-emitting element. One of ends of the second wiring is bonded to the support member equipped with the first light-emitting element, and the other of the ends of the second wiring is bonded to the second surface of the second light-emitting element or the second support member. One of ends of the third wiring is bonded to the first protective element. One of ends of the fourth wiring is bonded to the second protective element. A current passes from the first light-emitting element to the second light-emitting element through a first current path running through the first wiring and the second wiring but not through the third wiring or the fourth wiring. A current passes from the first protective element to the second light-emitting element through a second current path running through the third wiring but not through the first wiring. A current passes from the first protective element to the second protective element through a third current path running through the third wiring and the fourth wiring but not through the first wiring or the second wiring.

A light-emitting device in which power can be supplied to light-emitting elements other than defective one of a plurality of light-emitting elements electrically connected in series by wirings can be provided.

DETAILED DESCRIPTION OF EMBODIMENTS

Figure 1:
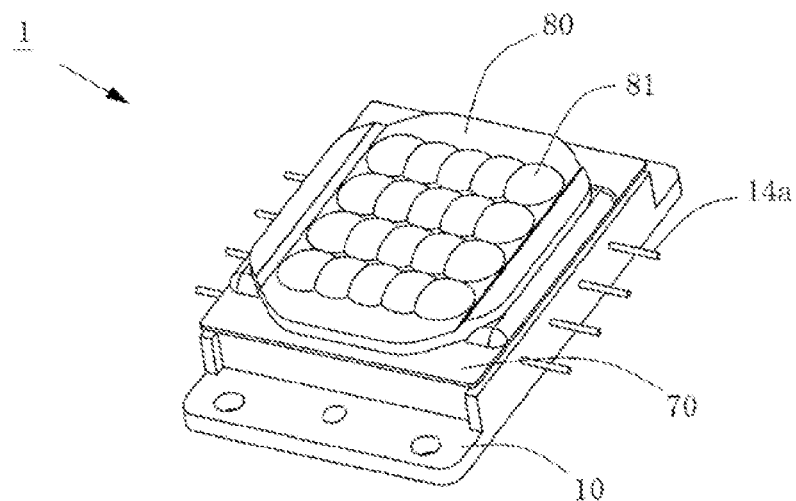
FIG. 1 is a schematic perspective view of a light-emitting device according to a first embodiment.

In the present specification or the claims, shapes referred to as polygons such as triangles and quadrilaterals include polygons with rounded, chamfered, beveled, or concave beveled corners. Not only shapes with modified corners (ends of sides) but also shapes with intermediate portions of sides modified are referred to as polygons. That is, shapes partially modified on the basis of polygons are interpreted as "polygons" disclosed in the present specification and the claims.

The same applies to not only polygons but also terms describing specific shapes such as trapezoids, circles, and rugged shapes. The same also applies to the case of each side constituting such a shape. That is, even if an end or an intermediate portion of a certain side has been modified, the modified portion is also interpreted as a portion of the "side." In the case in which a "polygon" or a "side" without partial modification is distinguished from modified shapes, the term "exact" is added, and a term such as an "exact quadrilateral" is used.

In the present specification or the claims, expressions such as up/down, right/left, front/back, front/rear, toward/away merely indicate relationships such as relative positions, orientations, and directions and do not have to coincide with relationships during use.

In the present specification or the claims, in the case in which a plurality of members correspond to a certain component and are distinguished from one another, the components may be expressed with "first" and "second." In the case in which objects or viewpoints of distinguishment are different between the present specification and the claims, the same ordinal number may not indicate the same object between the present specification and the claims.

For example, in the case in which objects are distinguished by the ordinal numbers "first," "second," and "third" in the present specification and where only the "first" and "third" ones in the present specification are described in the claims, the ordinal numbers "first" and "second" may be used to achieve distinguishment in the claims for the ease of seeing. In this case, the "first" and "second" objects in the claims indicate the "first" and "third" objects in the present specification.

Embodiments of the present disclosure are described below referring to the accompanying drawings. The embodiments described below are concrete forms of the technical idea of the present invention but do not limit the present invention. In the description below, the same term or reference numeral represents the same member or a similar member, and repetitive descriptions may be omitted as appropriate. Sizes or positional relationships of components illustrated in the drawings may be exaggerated in order to clarify the descriptions.

First Embodiment

Figure 2:
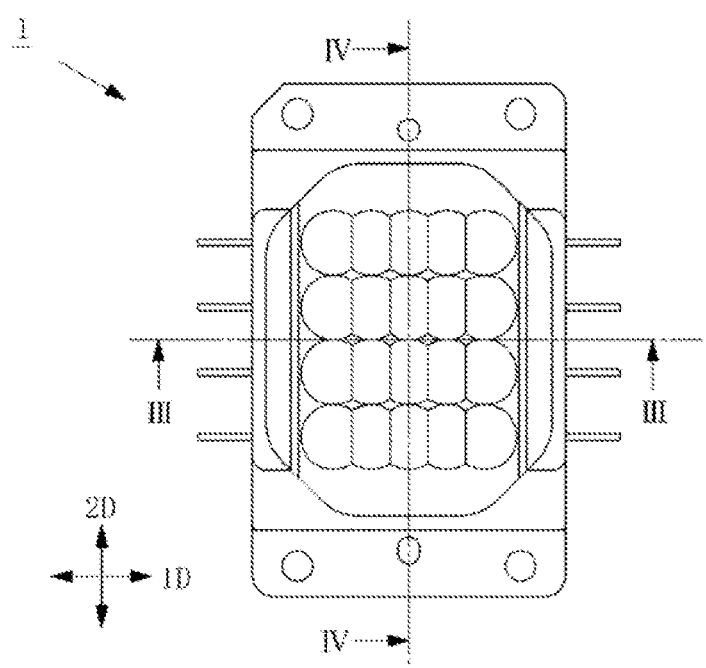
FIG. 2 is a schematic top view corresponding to FIG. 1.
Figure 3:
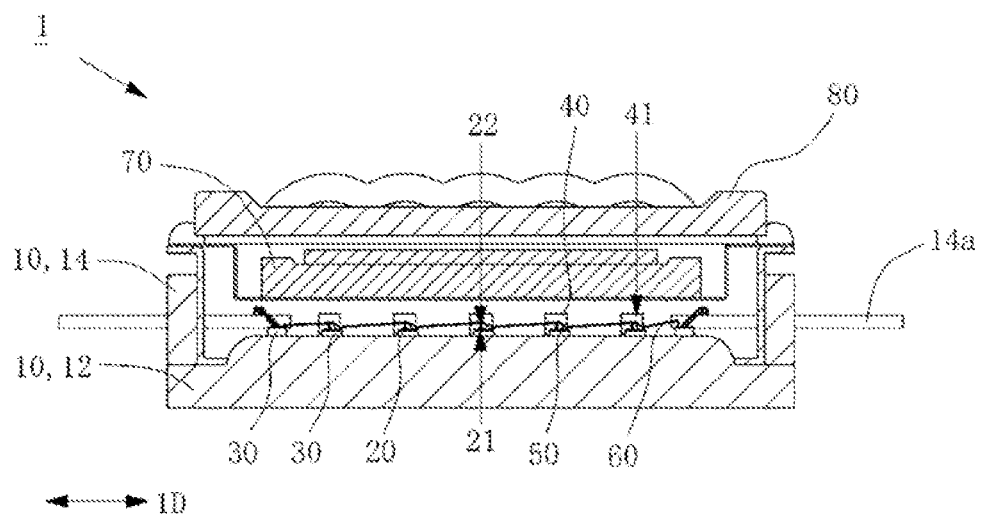
FIG. 3 is a schematic cross-sectional view of the light-emitting device taken along the line III-III of FIG. 2.
Figure 4:
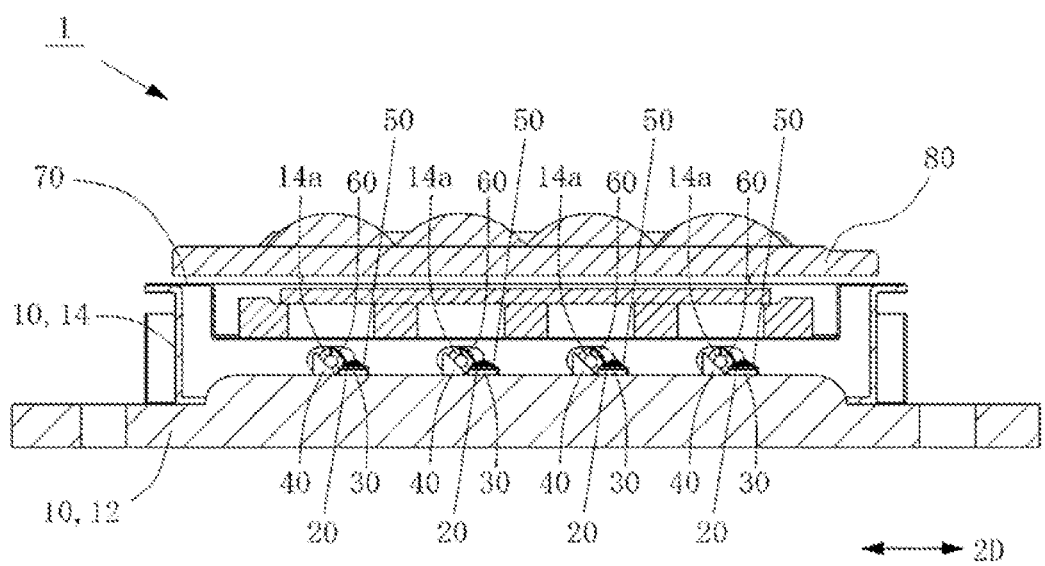
FIG. 4 is a schematic cross-sectional view of the light-emitting device taken along the line IV-IV of FIG. 2.
Figure 5:
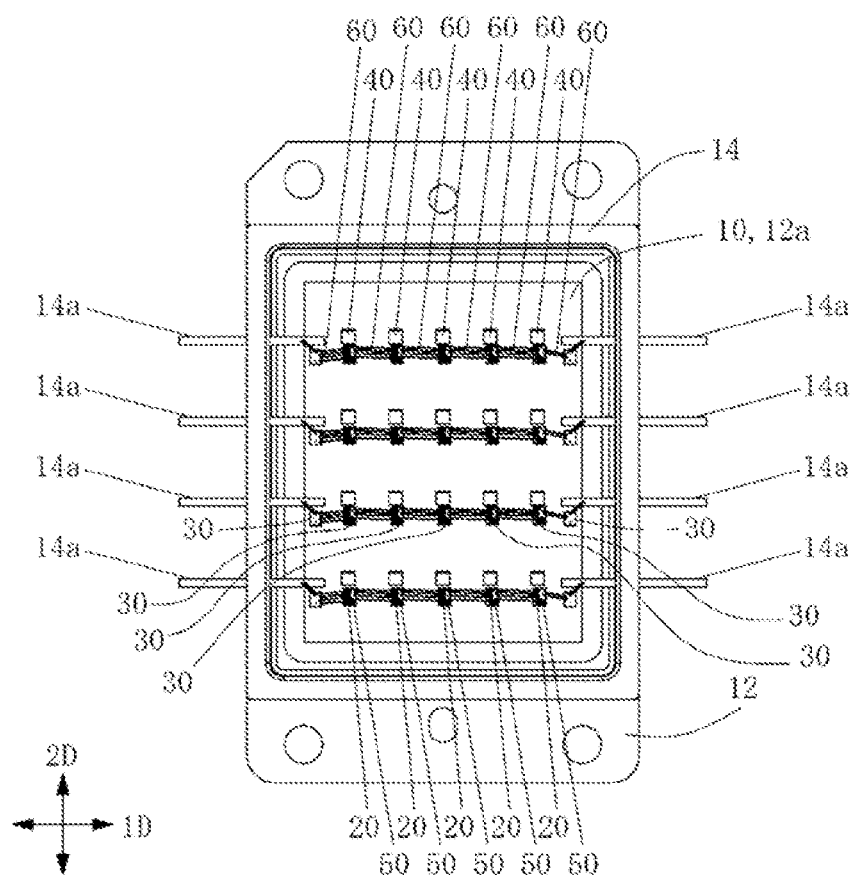
FIG. 5 is a schematic top view illustrating the internal structure of the light-emitting device according to the first embodiment.
Figure 6A:
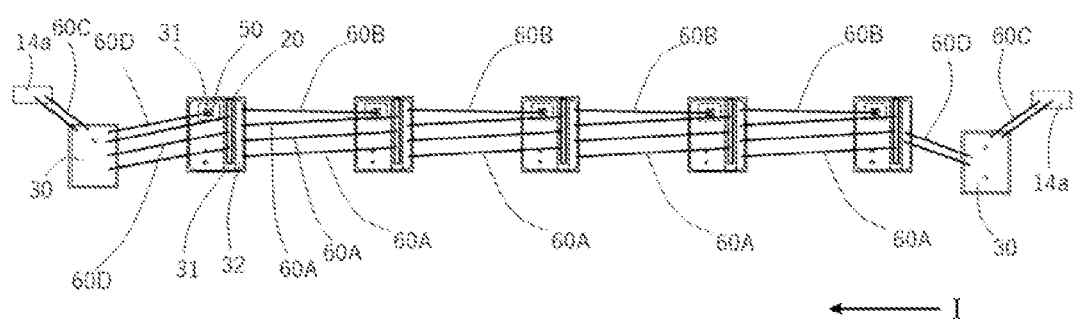
FIG. 6A is a schematic top view of a portion of the light-emitting device according to the first embodiment for illustrating wiring connections.

A light-emitting device according to a first embodiment is described. FIG. 1 is a schematic perspective view of a light-emitting device 1, which is an example of the light-emitting device according to the first embodiment. FIG. 2 is a schematic top view of the light-emitting device 1. FIG. 3 is a schematic cross-sectional view of the light-emitting device 1 taken along the line III-III of FIG. 2. FIG. 4 is a schematic cross-sectional view of the light-emitting device 1 taken along the line IV-IV of FIG. 2. FIG. 5 is a schematic top view illustrating the internal structure in which some of components of the light-emitting device 1 has been removed. FIG. 6A is a schematic top view illustrating wiring connections for electrical connections between a plurality of light-emitting elements 20 aligned in a first direction in the light-emitting device 1. The arrow "I" in FIG. 6A indicates the direction in which a current flows.

The light-emitting device 1 includes a plurality of components including a base member 10, the light-emitting elements 20, a plurality of support members 30, one or more light-reflective members 40, a plurality of protective elements 50, a plurality of wirings 60, a sealing member 70, and a lens member 80. The light-emitting device 1 may further include other components.

Subsequently, each component is described.

Base Member 10

The base member 10 includes a base portion 12 and a lateral wall 14 projecting upward from the base portion 12. The base portion 12 and the lateral wall 14 form a recessed shape in which the inside of the lateral wall 14 is recessed. In other words, the base member 10 has a recessed portion 10a defining the recessed shape.

The base portion 12 has a projection 12a. The projection 12a is surrounded by the lateral wall 14. The recessed portion 10a includes the projecting portion of the projection 12a. The uppermost surface of the projection 12a is located below the uppermost surface of the recessed portion 10a. The uppermost surface of the projection 12a serves as a mounting surface on which other components are mounted. With the base portion 12 having the projection 12a, a warp of the mounting surface can be reduced even in the case in which the base portion 12 and the lateral wall 14 are made of different materials. The shape of the base member 10 is not limited to the above shape but may be, for example, a flat plate shape.

The base member 10 includes a plurality of wiring portions 14a. The wiring portions 14a each include an inner wiring region inside the recessed portion 10a and an outer wiring region outside the recess. The inner wiring region and the outer wiring region of the wiring portion 14a are electrically conductive. The inner wiring region is bonded to components disposed in the recessed portion 10a.

The wiring portion 14a is disposed through the lateral wall 14. For example, the wiring portion 14a can be disposed using a lead pin penetrating through the lateral wall 14. The base member 10 can include one or more wiring portions 14a in each of facing wall surfaces of the lateral wall 14.

For example, the base member 10 can be formed of a metal material such as iron, an iron alloy, and copper.

Alternatively, a ceramic material such as AlN, SiC, and SiN can be used. The base member 10 can be formed by forming the base portion 12 and the lateral wall 14 using different materials and bonding these members. Metal lead pins can be employed for the wiring portions 14a.

Light-Emitting Element 20

The light-emitting elements 20 each have a light exit surface from which light is emitted. For example, a semiconductor laser element can be employed for the light-emitting element 20. The light-emitting element 20 has an upper surface, a lower surface, and one or more lateral surfaces. One lateral surface of the light-emitting element 20 is a light exit surface. The light exit surface can be another surface of the light-emitting element 20.

The light-emitting element 20 has a first surface 21 and a second surface 22 opposite to the first surface 21. The first surface 21 or the second surface 22 can be a bonding surface bonded to another component. The lower surface of the light-emitting element 20 is the first surface 21, and the upper surface of the light-emitting element 20 is the second surface 22. The first surface 21 and the second surface 22 are not the light exit surface but may be the light exit surface.

The light-emitting element 20 includes a p-electrode and an n-electrode. For example, in the light-emitting element 20, the p-electrode is disposed on the first surface 21, and the n-electrode is disposed on the second surface 22. Alternatively, for example, in the light-emitting element 20, the n-electrode is disposed on the first surface 21, and the p-electrode is disposed on the second surface 22. Alternatively, for example, in the light-emitting element 20, the p-electrode and the n-electrode are disposed on the first surface 21.

The peak emission wavelength of the light-emitting element 20 falls within the range of 320 nm to 530 nm, typically within the range of 430 nm to 480 nm. For example, a semiconductor element containing a nitride semiconductor can be employed as such a light-emitting element 20. For the nitride semiconductor, for example, GaN, InGaN, and AlGaN can be used. The peak emission wavelength of the light-emitting element 20 is not limited to the above wavelength range.

A semiconductor laser element, which is an example of the light-emitting element 20, is described. Light (laser beam) radiated from the semiconductor laser element has divergence and forms an elliptic far-field pattern (hereinafter referred to as "FFP") in a plane parallel to an emission end surface of the light. The FFP indicates the shape and light intensity distribution of emitted light at a position away from the emission end surface.

Light passing through the center of the elliptic FFP, in other words, light with the peak intensity in the light intensity distribution of the FFP, is referred to as light traveling on an optical axis. The optical path of the light traveling on an optical axis is referred to as the optical axis of the light. Light having an intensity of $1/e^2$ (e is the Napier's constant) or more of the peak intensity in the light intensity distribution of the FFP is referred to as the "main portion" of light.

As for the elliptic FFP of light emitted from the semiconductor laser element, the minor axis direction of the ellipse is referred to as the slow axis direction of the FFP, and the major axis direction is referred to as the fast axis direction of the FFP. A semiconductor laser element in which the direction of layering of a plurality of layers including an active layer constituting the semiconductor laser element coincides with the fast axis direction of the FFP can be employed for the light-emitting element 20.

The angle at the intensity corresponding to $1/e^2$ of the peak intensity based on the light intensity distribution of the FFP of the semiconductor laser element is referred to as a spread angle of light of the semiconductor laser element. As for the semiconductor laser element, the spread angle of light in the fast axis direction is larger than the spread angle of light in the slow axis direction.

Support Member 30

The support members 30 each has a lower surface, an upper surface, and one or more lateral surfaces. The width of the support member 30 is the smallest in the upper-lower direction. The shape of the support member 30 is a rectangular parallelepiped. The shape is not limited to a rectangular parallelepiped.

The support member 30 can serve as a support member on which other components are mounted. The support member 30 can be used for electrical connections. The support member 30 includes a conducting region used for establishing electrical connections. The support member 30 includes a bonding region 31 and a conducting region 32 electrically connected to the bonding region 31. The bonding region 31 and the conducting region 32 are formed on the same surface of the support member 30. Other components can be mounted on this surface of the support member 30. Other components are bonded to the bonding region 31. The conducting region 32 can be electrically connected to the other components bonded to the bonding region 31.

The bonding region 31 is continuous with the conducting region 32. In other words, the bonding region 31 and the conducting region 32 can be defined as segments of a single region. The support member 30 may include a conducting region 32 not continuous with the bonding region 31. In this case, for example, a conducting region 32 not continuous with the bonding region 31 and a conducting region 32 continuous with the bonding region 31 can be electrically connected by a wiring.

The support member 30 can include a plurality of bonding regions 31. The bonding regions 31 are formed on the same surface of the support member 30. The conducting region 32 can be electrically connected to a plurality of bonding regions 31. The bonding regions 31 may include a bonding region 31 continuous with the conducting region 32 and a bonding region 31 not continuous with the conducting region 32.

For example, the support member 30 is formed of, silicon nitride, aluminum nitride, or silicon carbide. Other materials may be used. For example, the conducting region 32 of the support member 30 can be formed by providing Ti/Pt/Au. For example, the bonding region 31 of the support member 30 can be formed by providing Pt/AuSn on a portion of the region provided with Ti/Pt/Au.

Light-Reflective Member 40

The light-reflective members 40 each have a light-reflective surface 41. For example, the light-reflective surface 41 has a reflectance of 90% or more with respect to a peak wavelength of irradiated light. The reflectance of light can be 100% or less or can be less than 100%.

The main material constituting the outer shape of the light-reflective member 40 can be glass or metal. The main material is preferably resistant to heat. For example, a glass such as quartz and BK7 (borosilicate glass), a metal such as aluminum, or Si can be used. For example, the light-reflective surface can be constituted of a metal such as Ag and Al or a dielectric multilayer film such as $Ta_2O_5/SiO_2$, $TiO_2/SiO_2$, and $Nb_2O_5/SiO_2$. The term "main material" refers to the material accounting for the highest proportion in the case in which a plurality of materials are used, but in the case in which a single material is used, refers to that material.

Protective Element 50

The protective elements 50 are circuit elements for preventing excessive currents from flowing through and breaking specific elements (such as the light-emitting elements 20). The protective elements 50 each have an upper surface and a lower surface. Typical examples of the protective elements 50 include voltage regulator diodes such as Zener diodes. For example, Si diodes can be used for the Zener diodes.

Wiring 60

The wirings 60 are each constituted of a linear electric conductor with both ends serving as joints. In other words, the wiring 60 include joints bonded to other components at both ends of the linear portion. The wiring 60 is used to electrically connect two components. For example, a metal wiring can be used for the wiring 60. Examples of the metal include gold, aluminum, silver, and copper.

Sealing Member 70

The sealing member 70 has an upper surface and a lower surface. The sealing member 70 is light-transmissive from the upper surface to the lower surface. The term "light-transmissive" indicates that the transmittance of main incident light is 80% or more.

The sealing member 70 may be partially light-transmissive. For example, the sealing member 70 may include a frame and one or more light-transmissive members. The frame has one or more openings and is not light-transmissive. The one or more light-transmissive members cover the one or more openings of the frame.

For example, a light-transmissive material such as glass, sapphire, and quartz can be used for the main material of the sealing member 70. For example, metal can be used for the main material of the frame, and the light-transmissive material described above can be used for the light-transmissive member.

Lens Member 80

The lens member 80 has an upper surface and a lower surface. The lens member 80 has a plurality of lens surfaces. The lens surfaces are formed on the upper surface side of the lens member 80. The upper surface of the lens member 80 includes a plurality of lens surfaces. A portion of the lens member 80 constituting each lens surface is referred to as a lens portion 81.

The lens member 80 can have an array of a plurality of lens surfaces. The lens member 80 can have a plurality of lens surfaces arranged in a matrix. The lens surfaces include at least three lens surfaces. The lens surfaces include at least three lens surfaces aligned. The lens member 80 can be formed of a light-transmissive material such as glass and synthetic quartz.

Light-Emitting Device 1

Subsequently, the light-emitting device 1 is described.

In the light-emitting device 1, the light-emitting elements 20 are each mounted on the support member 30. One or more light-emitting elements 20 are mounted on a single support member 30. The first surface 21 of each light-emitting element 20 is bonded to the bonding region 31 of the support member 30. The conducting region 32 of the support member 30 is electrically connected to the light-emitting element 20 bonded to the bonding region 31. In the example of the light-emitting device 1 shown in the drawings, a single light-emitting element 20 is mounted on each of the support members 30. An edge-emitting semiconductor laser element in which a lateral surface serves as the light exit surface is employed as the light-emitting element 20.

For example, the p-electrode of the light-emitting element 20 is bonded to the bonding region 31. Alternatively, for example, the n-electrode of the light-emitting element 20 is bonded to the bonding region 31. Alternatively, for example, the p-electrode and the n-electrode of the light-emitting element 20 are bonded to bonding regions 31 of different support members 30.

In the light-emitting device 1, the support members 30 equipped with the light-emitting elements 20 are disposed on the mounting surface of the base member 10. The support members 30 are mounted on the mounting surface of the base member 10 using the surfaces opposite to the surfaces on which the light-emitting elements 20 have been mounted. A plurality of support members 30 are disposed on the mounting surface of the base member 10.

The light-emitting device 1 can include three or more support members 30 equipped with light-emitting elements 20. The light-emitting device 1 can include 10 or more support members 30 equipped with light-emitting elements 20. In the example of the light-emitting device 1 shown in the drawings, 20 support members 30 equipped with light-emitting elements 20 are disposed.

In the light-emitting device 1, a plurality of light-emitting elements 20 are disposed on the mounting surface of the base member 10. The light-emitting elements 20 are disposed on the mounting surface of the base member 10 via the support members 30. A plurality of light-emitting elements 20 are disposed in the recessed portion 10a.

The light-emitting device 1 includes a plurality of support members 30 aligned in the first direction in a top view. The support members 30 are disposed at regular intervals in the first direction. The support members 30 aligned in the first direction are oriented in the same direction in a top view. In the example of the light-emitting device 1 shown in the drawings, the direction indicated by the reference numeral "1D" is the same as the first direction.

The light-emitting device 1 includes a plurality of support members 30 aligned in a second direction perpendicular to the first direction in a top view. The support members 30 are disposed at regular intervals in the second direction. The support members 30 aligned in the second direction are oriented in the same direction in a top view. In the example of the light-emitting device 1 shown in the drawings, the direction indicated by the reference numeral "2D" is the same as the second direction. In the example of the light-emitting device 1 shown in the drawings, 20 support members are arranged in a 4×5 matrix.

The light exit surfaces of the light-emitting elements 20 mounted on the support members 30 aligned in the first direction are oriented in the same direction. The light exit surfaces of the light-emitting elements 20 aligned in the first direction are located in the same imaginary plane. The light exit surfaces of the light-emitting elements 20 mounted on the support members 30 aligned in the second direction are oriented in the same direction. In the example of the light-emitting device 1 shown in the drawings, the optical axes of light emitted from the light exit surfaces of a plurality of light-emitting elements 20 (semiconductor laser elements) are parallel to the second direction.

A plurality of support members 30 are arranged in a matrix in the first direction and the second direction. The number of support members 30 aligned in the first direction can be two or more. The number of support members 30 aligned in the second direction can be one or more. In the case in which the number of support members 30 aligned in the second direction is one, the number of support members 30 aligned in the first direction can be three or more.

In the light-emitting device 1, support members 30 not equipped with light-emitting elements 20 can be disposed. A pair of support members 30 not equipped with light-emitting elements 20 are disposed corresponding to a plurality of support members 30 aligned in the first direction. The support members 30 not equipped with light-emitting elements 20 are respectively disposed away in the first direction from the support members 30 located at both ends of the support members 30 aligned in the first direction. The support members 30 not equipped with light-emitting elements 20 are disposed outside the support members 30 arranged in a matrix.

In the light-emitting device, the light-reflective member(s) 40 are disposed on the mounting surface of the base member 10. One or more light-reflective members 40 are disposed on the mounting surface of the base member 10. The light-reflective members 40 are disposed such that the light-reflective surfaces 41 face the light exit surfaces of the light-emitting elements 20.

The light-reflective members 40 can be respectively disposed for a plurality of light-emitting elements 20. In this case, the light-emitting device 1 includes a plurality of light-reflective members 40, and the number of light-reflective members 40 is equal to or larger than the number of the light-emitting elements 20.

A single light-reflective member 40 may reflect light emitted from a plurality of light-emitting elements 20 aligned in the first direction. In this case, the distance between both ends of the light-reflective member 40 in the first direction is larger than the distance between the two light-emitting elements 20 located at both ends of a plurality of light-emitting elements 20 aligned in the first direction.

In the case in which the number of support members 30 aligned in the second direction is two or more, a plurality of light-emitting elements 20 and a plurality of light-reflective members 40 are alternately aligned in the second direction. That is, a light-reflective member 40 is disposed between two light-emitting elements 20 aligned in the second direction, and a light-emitting element 20 is disposed between two light-reflective members 40 aligned in the second direction.

The main portion of light emitted from the light-emitting elements 20 is reflected by the light-reflective surfaces 41. The reflected light travels in a different direction, such as the upward direction. The light-reflective members 40 allow light to upwardly exit from the light-emitting device 1 using the light-emitting elements 20 in which the lateral surfaces serve as the light exit surfaces. For example, in the case in which the light-emitting elements 20 are end-face emitting semiconductor laser elements, the light exit surfaces of the light-emitting elements 20 can be main sources of heat emitted from the light-emitting elements 20, and the heat dissipation performance can be improved by bringing the light exit surfaces close to the support members 30 or the base member 10.

In the light-emitting device 1, protective elements 50 are disposed on the mounting surface of the base member 10. A plurality of protective elements 50 are disposed on the mounting surface. The protective elements 50 are not directly mounted on the mounting surface. However, the protective elements 50 can be directly disposed on the mounting surface. The protective elements 50 can be mounted on the support members 30.

A plurality of protective elements 50 respectively correspond to a plurality of light-emitting elements 20. Each protective element 50 is disposed near the corresponding light-emitting element 20. For example, each protective element 50 is disposed on the support member 30 equipped with the corresponding light-emitting element 20. In the case in which the protective element 50 is disposed near the corresponding light-emitting element 20, the corresponding one of a plurality of light-emitting elements 20 is the closest to this protective element 50. In the example of the light-emitting device 1 shown in the drawings, a single protective element 50 is mounted on each of the support members 30.

The protective element 50 is bonded to the bonding region 31 of the support member 30. This bonding region 31 differs from the bonding region 31 bonded to the light-emitting element 20. The conducting region 32 of the support member 30 is electrically connected to the protective element 50 bonded to the bonding region 31. The conducting region 32 of the support member 30 is electrically connected to the bonding region 31 bonded to the protective element 50 and the bonding region 31 bonded to the light-emitting element 20.

In the example of the light-emitting device 1 shown in the drawings, the protective element 50 is aligned with the light-emitting element 20 in the first direction. The length of the protective element 50 in the second direction is shorter than the length of the light-emitting element 20 in the second direction. The protective element 50 is disposed between two imaginary straight lines respectively passing through both ends of the light-emitting element 20 in the second direction and parallel to the first direction in a top view.

The number of protective elements 50 in the light-emitting device 1 is the same as the number of light-emitting elements 20 aligned in the first direction. The light-emitting device 1 may include other protective elements than the protective elements 50. In the example of the light-emitting device 1 shown in the drawings, the light-emitting device 1 does not include other protective elements than the protective elements 50, and the number of the protective elements 50 in the light-emitting device 1 is equal to the number of light-emitting elements 20 in the light-emitting device 1.

In the light-emitting device 1, a plurality of wirings 60 are used to supply the light-emitting elements 20 with power from an external device. The wirings 60 electrically connect the light-emitting elements 20 to the wiring portions 14a. The wirings 60 include one or more wirings 60, one of the ends of each wiring 60 being bonded to the inner wiring region.

A plurality of wirings 60 electrically connect a plurality of light-emitting elements 20 in series. A plurality of wirings 60 electrically connect a plurality of light-emitting elements 20 aligned in the first direction in series. A plurality of light-emitting elements 20 aligned in the first direction among a plurality of light-emitting elements 20 are electrically connected to each other in series. A plurality of light-emitting elements 20 aligned in the second direction are not electrically connected to each other in series. The light-emitting elements 20 aligned in the second direction are electrically connected to each other in parallel.

A plurality of wirings 60 electrically connect a plurality of protective elements 50 in series. A plurality of wirings 60 electrically connect a plurality of protective elements 50 aligned in the first direction in series. A plurality of protective elements 50 aligned in the first direction among a plurality of protective elements 50 are electrically connected to each other in series. A plurality of protective elements 50 aligned in the second direction are not electrically connected to each other in series. The protective elements 50 aligned in the second direction are electrically connected to each other in parallel.

In a top view, the distance between a light-emitting element 20 mounted on a support member 30 and a protective element 50 corresponding to the light-emitting element 20 is shorter than the distance between the support member 30 and an adjacent support member 30. For example, the longer distance can be twice or more as long as the shorter distance. For example, the longer distance can be 50 times or less as long as the shorter distance.

The shorter the wirings 60 are, the smaller the loads applied to the wirings 60 when a current is applied are. Accordingly, in the case in which the protective element 50 is close to the corresponding one of the light-emitting elements 20, the light-emitting element 20 may be electrically connected to the protective element 50 by wirings. On the other hand, in the example of the light-emitting device 1 shown in the drawings, no wirings are bonded to both the light-emitting element 20 and the protective element 50 to electrically connect the light emitting element 20 and the protective element 50.

In a top view, the distance between a light-emitting element 20 mounted on a support member 30 and a protective element 50 corresponding to the light-emitting element 20 is shorter than the length of a wiring 60 bonded to the protective element 50. For example, the length of the wiring 60 can be twice or more as long as the distance between the light-emitting element 20 and the protective element 50. For example, the length of the wiring 60 can be three times or more as long as the distance between the light-emitting element 20 and the protective element 50. For example, the length of the wiring 60 can be 50 times or less as long as the distance between the light-emitting element 20 and the protective element 50.

A plurality of wirings 60 electrically connect a plurality of light-emitting elements 20 aligned in the first direction also to the corresponding protective elements 50. A plurality of wirings 60 provide one of two adjacent light-emitting elements 20 with a current path passing through the other light-emitting element 20 and a current path bypassing the other light-emitting element 20 but passing through the protective element 50 corresponding to the other light-emitting element 20. With this structure, even in the case in which any of a plurality of light-emitting elements 20 is defective, power feeding to the other light-emitting elements 20 can be maintained by the current path passing through the protective element 50 corresponding to the defective light-emitting element 20. A specific arrangement of a plurality of wirings 60 is described below.

A plurality of wirings 60 include one or more wirings 60A each having both ends, one of the ends being located inside one of two adjacent support members 30 in the first direction, and the other end being located inside the other support member 30 in a top view. One of the ends of the wiring 60A is bonded to the support member 30 or the light-emitting element 20. The other end is bonded to the support member 30 or the light-emitting element 20.

A plurality of wirings 60 include one or more wirings 60B each having both ends, one of the ends being located inside one of two adjacent support members 30 in the first direction, and the other end being located inside the other support member 30 in a top view. One of the ends of the wiring 60B is bonded to the support member 30 or the protective element 50. The other end is bonded to the support member 30.

A plurality of wirings 60 include one or more wirings 60C each bonded to a wiring portion 14a and a support member 30 not equipped with a light-emitting element 20. A plurality of wirings 60 include one or more wirings 60D each bonded to a support member 30 not equipped with a light-emitting element 20 and a support member 30 equipped with a light-emitting element 20, the light-emitting element 20 mounted on the support member 30, or a protective element 50.

The example of the light-emitting device 1 shown in the drawings includes: wirings 60C bonded to one of a pair of wiring portions 14a and a support member 30 not equipped with a light-emitting element 20; wirings 60D bonded to the support member 30 not equipped with a light-emitting element 20 and the conducting region 32 of a support member 30 equipped with a light-emitting element 20; one or more wirings 60A bonded to the second surface 22 of a light-emitting element 20 mounted on one of two adjacent support members 30, the one being on the near side of the current path, and the conducting region 32 of the support member 30 on the far side of the current path; wirings 60D bonded to the second surface 22 of a light-emitting element 20 and a support member 30 not equipped with a light-emitting element 20; and wirings 60C bonded to the support member 30 not equipped with a light-emitting element 20 and the other one of the pair of wiring portions 14a along the current path.

The example of the light-emitting device 1 shown in the drawings also includes: one or more wirings 60B bonded to the upper surface of a protective element 50 mounted on one of two adjacent support members 30, the one being on the near side of the current path, and the conducting region 32 of the support member 30 on the far side of the current path; and a wiring 60D bonded to the upper surface of a protective element 50 and a support member 30 not equipped with a light-emitting element 20. This structure secures, as a path of a current from the one support member 30 to the other support member 30, a path passing through the light-emitting element 20 mounted on the one support member 30 and a path passing through the protective element 50 mounted on the one support member 30.

In the example of the light-emitting device 1 shown in the drawings, a plurality of wirings 60A are respectively bonded to the second surfaces 22 of a plurality of light-emitting elements 20. The number of wirings 60 bonded to the light-emitting elements 20 is larger than the number of wirings 60 bonded to the corresponding protective elements 50. The wirings 60 bonded to the corresponding protective elements 50 are thicker than the wirings 60 bonded to the light-emitting elements 20. In the case in which a light-emitting element 20 is defective, a current passes through the protective element 50, instead of the light-emitting element 20. The current path can be stably secured by using a thick wiring 60 to compensate for the lack in the number of wirings 60.

For connections, two wirings 60, i.e., a first wiring and a second wiring, may be used instead of a single wiring 60 connecting the light-emitting element 20 mounted on one support member 30 and the conducting region 32 of the other support member 30. The first wiring may connect the two support members 30, while the second wiring may connect the support member 30 and the light-emitting element 20. In the light-emitting device 1, a wiring 60A can connect two adjacent support members 30, one end of the wiring 60A being bonded to one of the support members 30, and the other end being bonded to the other support member 30 or the light-emitting element 20 mounted on the other support member 30.

In the example of the light-emitting device 1 shown in the drawings, the protective element 50 bonded to one end of the wiring 60B is located closer to the support member 30 bonded to the other end of the wiring 60B than the light-emitting element 20 mounted on the support member 30 equipped with the protective element 50. The wiring 60B bonded to the protective element 50 mounted on the support member 30 is shorter than the wiring 60A bonded to the light-emitting element 20 mounted on this support member 30 in a top view. By making the wiring 60 for the protective element 50 shorter than the wiring 60 for the light-emitting element 20, the current load applied to the wiring 60 for the protective element 50 can be reduced.

In the example of the light-emitting device 1 shown in the drawings, the wirings 60B do not overlap with the light-emitting elements 20 in a top view. Accordingly, the wirings 60B do not pass directly above the light-emitting elements 20. In the case in which the light-emitting element 20 and the protective element 50 are mounted on the support member 30, for example, a wiring 60B that is bonded to the protective element 50 and passes directly above the light-emitting element 20 can be damaged or broken when the light-emitting element 20 is defective. Such a situation can be suppressed by preventing the wiring 60B from overlapping with the light-emitting element 20 in a top view.

Figure 6B:
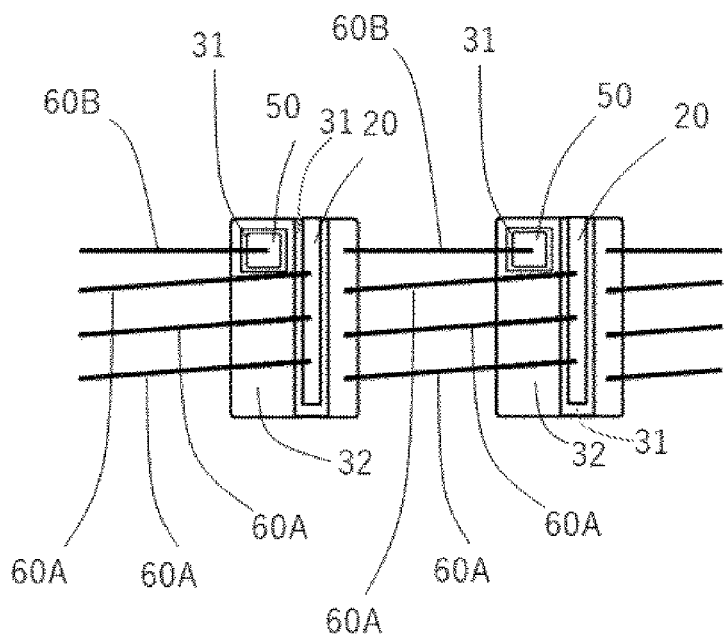
FIG. 6B is another schematic top view of a portion of the light-emitting device according to the first embodiment for illustrating wiring connections.

The wirings 60A can be bonded so as not to overlap with the protective element 50 in a top view. FIG. 6B is a top view illustrating a state in which the wirings are connected. As shown in FIG. 6B, none of the wirings 60A connected to the light-emitting element 20 overlap with the protective element 50 in a top view. Accordingly, the wirings 60A do not pass directly above the protective element 50.

The protective element 50 is located in a region between an imaginary line passing through one end of the wiring 60A while being parallel to the second direction and another imaginary line passing through the other end of this wiring 60A while being parallel to the second direction. The wirings 60 include a wiring 60A in which one of the both ends is connected to the light-emitting element 20 while the distance between the other end and the protective element 50 corresponding to this light-emitting element 20 is shorter than the distance between the other end and this light-emitting element 20.

In the case in which a portion of the wiring 60A is located at a position overlapping with the outer edge of the protective element 50 in a top view, false recognition by the wiring 60A may occur at the visual inspection that checks whether the protective element 50 is appropriately disposed. In other words, overlapping of the wiring 60A with the protective element 50 may cause false recognition that the protective element 50 is inappropriately mounted despite that the protective element 50 is mounted at the appropriate position. Accordingly, positioning the wiring 60A so as not to overlap with the protective element 50 in a top view may suppress such a false recognition.

In the example of the light-emitting device 1 shown in the drawings, the protective element 50 is disposed at a position close to the light exit surface of the light-emitting element 20. The protective element 50 is disposed at a position closer to the lateral surface serving as the light exit surface (hereinafter referred to as a "first lateral surface") of the light-emitting element 20 than to the lateral surface (hereinafter referred to as a "second lateral surface") located opposite to the first surface. This may connect the wiring 60A to the light-emitting element 20 at a position sufficiently far from the first lateral surface, resulting in suppression of catastrophic failure of the light-emitting element 20.

The wirings 60A connected to the light-emitting element 20 are located closer to the second lateral surface than the protective element 50 in a top view. Among the wirings 60A, one connected to the light-emitting element 20 at a position closest to the first lateral surface is located away with the distance of 250 μm or more from the first lateral surface.

Figure 6C:
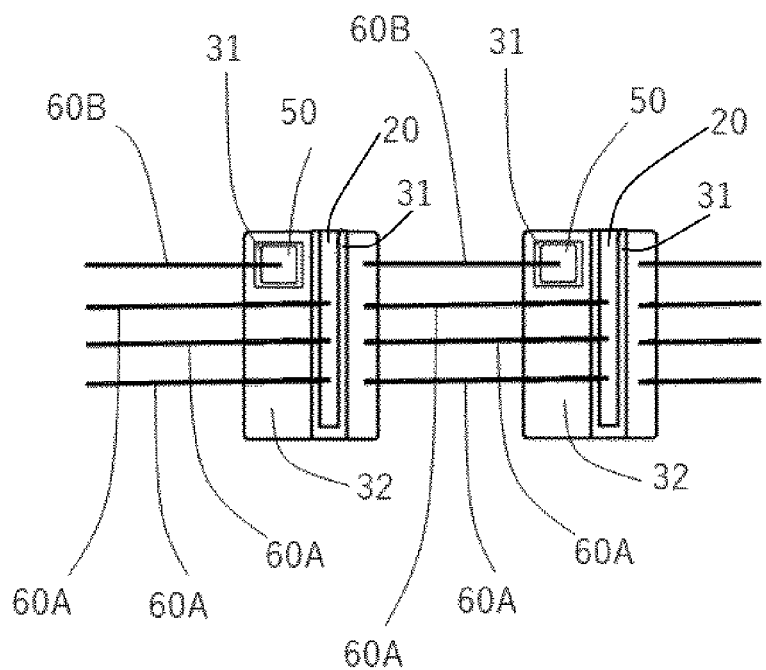
FIG. 6C is another schematic top view of a portion of the light-emitting device according to the first embodiment for illustrating wiring connections.

In the case in which the wirings 60A connected to the light-emitting element 20 are located too close to the first lateral surface, an occurrence of a catastrophic failure may be increased, however in the case in which the wirings 60A connected to the light-emitting element 20 are located too far from the first lateral surface, luminance characteristic or temperature characteristic may be reduced. Accordingly, the wiring 60A closest to the first lateral surface is preferably located away from the first lateral surface with a distance in a range of 250 μm to 550 μm. FIG. 6C is an example of the light-emitting device 1 in which the wirings 60A are located closer to the second lateral surface side than FIG. 6B, however this example also satisfies the above-described range of distance.

The wirings 60A are connected to the light-emitting element 20 with a predetermined interval. The wirings 60A include at least three wirings 60A. Among the wirings 60A, one located closest to the first lateral surface is located at a greater distance from the first lateral surface than the predetermined interval of the wirings 60A while being located at a greater distance than a distance between one closest to the second lateral surface and the second lateral surface.

Viewing the support member 30 by dividing the upper surface using an imaginary line that passes the midpoint between the first and second lateral surfaces of the light-emitting element 20 and is parallel to the first direction in a top view, the protective element 50 corresponding to the light-emitting element 20 is located in a divided area closer to the first lateral surface. The protective element 50 is not located in a divided area closer to the second lateral surface, and connection portion of at least one of the wirings 60A connected to the light-emitting element 20 is located in this divided area.

A current may flow in the reverse direction in the light-emitting device 1. In this case, the example of the light-emitting device 1 shown in the drawings includes: wirings 60C bonded to one of a pair of wiring portions 14a and a support member 30 not equipped with a light-emitting element 20; wirings 60D bonded to the support member 30 not equipped with a light-emitting element 20 and the second surface 22 of a light-emitting element 20; one or more wirings 60A bonded to the conducting region 32 of one of two adjacent support members 30, the one being on the near side of the current path, and the second surface 22 of a light-emitting element 20 mounted on the support member 30 on the far side of the current path; wirings 60D bonded to the conducting region 32 of a support member 30 equipped with a light-emitting element 20 and a support member 30 not equipped with a light-emitting element 20;

and wirings 60C bonded to the support member 30 not equipped with a light-emitting element 20 and the other one of the pair of wiring portions 14a along the current path.

The example of the light-emitting device 1 shown in the drawings also includes: one or more wirings 60B bonded to the conducting region 32 of one of two adjacent support members 30, the one being on the near side of the current path, and bonded to the upper surface of a protective element 50 mounted on the support member 30 on the far side of the current path; and a wiring 60D bonded to the conducting region 32 of the support member 30 equipped with a protective element 50 and a support member 30 not equipped with a light-emitting element 20.

The form of electrical connections by a plurality of wirings 60 is described on the basis of two light-emitting elements 20 among a plurality of light-emitting elements 20 aligned in the first direction. The two light-emitting elements 20 are referred to as a first light-emitting element and a second light-emitting element, a support member 30 equipped with the first light-emitting element is referred to as a first support member, and a support member 30 equipped with the second light-emitting element is referred to as a second support member. Two protective elements 50 among a plurality of protective elements 50 are respectively referred to as a first protective element and a second protective element. In this case, the followings can be stated regarding the light-emitting device 1.

A plurality of wirings 60 include a first wiring, one of the ends of the first wiring being bonded to the second surface 22 of one of the first light-emitting element and the second light-emitting element. The wirings 60 include a second wiring, one of the ends of the second wiring being bonded to the support member 30 equipped with one of the light-emitting elements 20 and the other end being bonded to the second surface 22 of the other one of the first light-emitting element and the second light-emitting element. The wirings 60 include a third wiring, one of the ends of the third wiring being bonded to the first protective element. The wirings 60 include a fourth wiring having, one of the ends of the fourth wiring being bonded to the second protective element.

Bonding the wirings 60 constitutes a current path passing through the first wiring and the second wiring and not passing through the third wiring or the fourth wiring. Through the current path, a current flows from the first light-emitting element to the second light-emitting element.

Bonding the wirings 60 also constitutes a current path passing through the third wiring. Through the current path, a current flows from the first protective element to the second light-emitting element. This current path does not pass through one of the first wiring and the second wiring bonded to the second surface 22 of the first light-emitting element. This current path can pass through one of the first wiring and the second wiring bonded to the second surface 22 of the second light-emitting element.

Further, a current path passing through the third wiring and the fourth wiring and not passing through the first wiring or the second wiring is formed. Through the current path, a current flows from the first protective element to the second protective element.

In the light-emitting device 1, the sealing member 70 is bonded to the base member 10. The lower surface of the sealing member 70 is bonded to the upper surface of the base member 10. The sealing member 70 is bonded to the upper surface of the recessed portion 10a of the base member 10. The sealing member 70 is bonded to the uppermost surface of the base member 10.

A sealed space is formed by bonding the base member 10 and the sealing member 70 together. The light-emitting elements 20 are confined in the sealed space. A hermetically sealed space can be formed by bonding the base member 10 and the sealing member 70 together in an atmosphere of a predetermined gas. By confining the light-emitting elements 20 in the sealed space as described above, dust collection on the light exit surfaces of the light-emitting elements 20 can be reduced, so that a decrease in the luminous efficacy can be reduced.

Light reflected by the light-reflective members 40 passes through the sealing member 70. The main portion of light passes through a light-transmissive portion of the sealing member 70 and is emitted from the sealing member 70.

In the light-emitting device 1, the lens member 80 is located above a plurality of light-emitting elements 20. The lens member 80 is disposed on or above the sealing member 70. The lens member 80 is bonded to the sealing member 70. For example, the lens member 80 is bonded using a UV-curable adhesive. Use of a UV-curable adhesive allows the position of mounting of the lens member 80 to be adjusted before bonding at a desired position.

The lens member 80 is disposed such that beams of light emitted from the light-emitting elements 20 respectively pass through and are emitted from individual lens surfaces.

The light-emitting device 1 that emits a plurality of beams of light can be manufactured as described above. A light-emitting device in which power can be supplied to light-emitting elements other than defect one of a plurality of light-emitting elements electrically connected in series can be provided.

MODIFIED EXAMPLES

Subsequently, modified examples of the light-emitting device 1 are described. FIG. 7 to FIG. 11 are schematic top views of respective modified examples of the light-emitting device 1. As with FIG. 6A, the schematic top views illustrate wiring connections for electrical connections between a plurality of light-emitting elements 20 aligned in the first direction. The arrow "I" in each drawing indicates the direction in which a current flows.

Each modified example differs from the first embodiment in the arrangements and positions of the light-emitting elements and the protective elements for electrical connections, form of wiring connections, and the like. The modified examples also have features in common with the first embodiment. The other features of the light-emitting device 1 in each modified example are the same as described above. Differences of each modified example from the first embodiment are described below.

Modified Example 1

Figure 7:
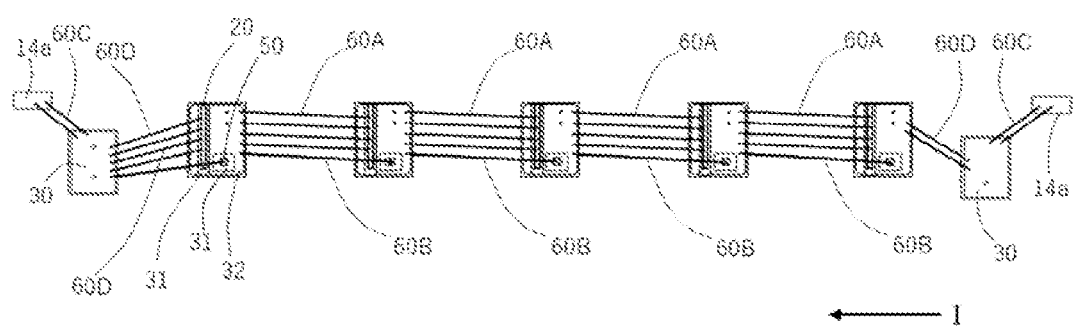
FIG. 7 is a schematic top view of a light-emitting device according to Modified Example 1 for illustrating wiring connections.

FIG. 7 is a drawing according to Modified Example 1. In Modified Example 1 of the light-emitting device 1 shown in the drawing, the conducting region 32 of the support member 30 connected to an end of the wiring 60A or the wiring 60B is larger than in the light-emitting device 1 of the first embodiment. The large conducting region 32 facilitates bonding of the wiring 60.

In Modified Example 1 of the light-emitting device 1 shown in the drawing, the protective element 50 bonded to one end of the wiring 60B is located farther from the support member 30 bonded to the other end of the wiring 60B than the light-emitting element 20 mounted on the support member 30 equipped with this protective element 50. The wiring 60B bonded to the protective element 50 mounted on the support member 30 is longer than the wiring 60A bonded to the light-emitting element 20 mounted on this support member 30 in a top view. This arrangement can secure a larger region of bonding of the wiring 60 to the support member 30. In Modified Example 1 of the light-emitting device 1 shown in the drawing, the wirings 60B overlap with the light-emitting elements 20 in a top view.

Modified Example 2

Figure 8:
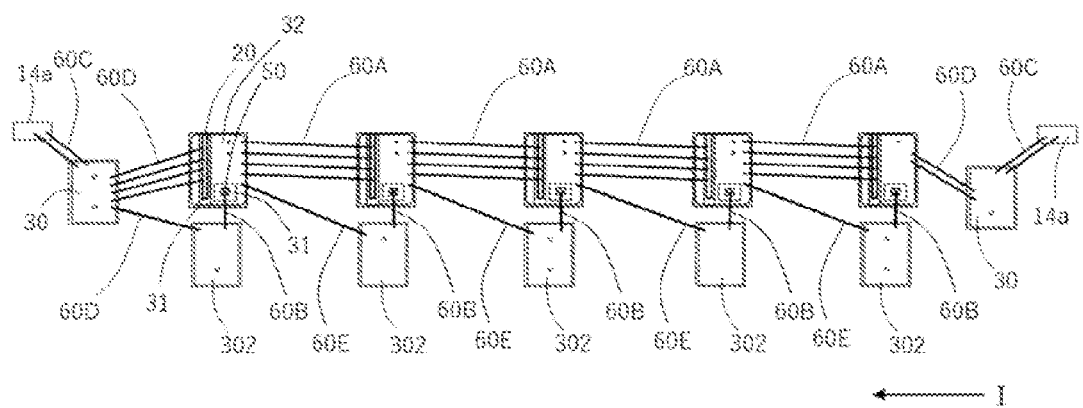
FIG. 8 is a schematic top view of a light-emitting device according to Modified Example 2 for illustrating wiring connections.

FIG. 8 is a drawing according to Modified Example 2. Modified Example 2 of the light-emitting device 1 shown in the drawing differs from the light-emitting device 1 of the first embodiment in that support members 302 are further included. The number of the support members 302 disposed is equal to the number of the protective elements 50 in the light-emitting device 1. The support members 302 respectively correspond to the protective elements 50. As with Modified Example 1, the conducting region 32 of the support member 30 connected to an end of the wiring 60A or the wiring 60B is larger than in the light-emitting device 1 of the first embodiment.

In both of the first embodiment and Modified Example 2, one of the ends of the wiring 60B is bonded to the support member 30 or the protective element 50. In Modified Example 2, the other end is bonded to the support member 302 not equipped with the light-emitting element 20 or the protective element 50, while, in the first embodiment, the other end is bonded to the support member 30 equipped with the light-emitting element 20 and the protective element 50.

In Modified Example 2, a plurality of wirings 60 do not include wirings 60D each bonded to the support member 30 not equipped with the light-emitting element 20 and the protective element 50 mounted on the support member 30 equipped with the light-emitting element 20. Instead, a plurality of wirings 60 include wirings 60D each bonded to the support member 30 not equipped with the light-emitting element 20 and the support member 302 not equipped with the light-emitting element 20 or the protective element 50.

A plurality of wirings 60 include one or more wirings 60E each having one of the ends located inside the support member 302 in a top view. The other end of the wiring 60E is located inside the support member 30 in a top view. One of the ends of the wiring 60E is bonded to the support member 302. The other end is bonded to the support member 30.

Modified Example 2 of the light-emitting device 1 shown in the drawing includes one or more wiring sets each including: a wiring 60B bonded to the upper surface of a protective element 50 mounted on one of two adjacent support members 30, the one being on the near side of the current path, and a support member 302 corresponding to the protective element 50; and one or more wirings 60E bonded to this support member 302 and the conducting region 32 of the support member 30 on the far side of the current path.

The one or more wiring sets, a wiring 60B bonded to the upper surface of a protective element 50 mounted on a support member 30 and the conducting region 32 of a support member 302 corresponding to the protective element 50, and a wiring 60D bonded to this support member 302 and a support member 30 not equipped with a light-emitting element 20 are disposed along the current path.

In Modified Example 2, the wirings 60 bonded to the protective elements 50 can be shorter than in the first embodiment. Accordingly, in Modified Example 2, the wirings 60 bonded to the protective elements 50 can be thinner than in the first embodiment. Accordingly, the wirings 60 bonded to the protective elements 50 can have a thickness equal to or less than the thickness of the wirings 60 bonded to the light-emitting elements 20.

In Modified Example 2, as with the first embodiment, the wiring 60B does not overlap with the light-emitting element 20 in a top view, and, as with Modified Example 1, the conducting region 32 of the support member 30 connected to an end of the wiring 60A or the wiring 60B is larger than in the light-emitting device 1 of the first embodiment.

A current may flow in the reverse direction in the light-emitting device 1 of Modified Example 2. In this case, the wiring set is constituted of: a wiring 60B bonded to the upper surface of a protective element 50 mounted on one of two adjacent support members 30, the one being on the near side of the current path, and a support member 302 corresponding to the protective element 50; and one or more wirings 60E bonded to this support member 30 and a support member 302 corresponding to a protective element 50 mounted on the support member 30 on the far side of the current path. A wiring 60D bonded to the support member 302 and a support member 30 not equipped with a light-emitting element 20, the one or more wiring sets, a wiring 60B bonded to the upper surface of a protective element 50 mounted on a support member 30 and the conducting region 32 of a support member 302 corresponding to the protective element 50 are disposed along the current path.

A plurality of wirings 60 include a fifth wiring in addition to the first wiring to the fourth wiring. One of the ends of the fifth wiring is bonded to a support member 302 corresponding to the first protective element. Further, the plurality of wirings 60 include a sixth wiring. One of the ends of the sixth wiring is bonded to a support member 302 corresponding to the second protective element.

Bonding the wirings 60 constitutes a current path passing through the first wiring and the second wiring and not passing through the third wiring, the fourth wiring, the fifth wiring, or the sixth wiring. Through the current path, a current flows from the first light-emitting element to the second light-emitting element.

Bonding the wirings 60 also constitutes a current path passing through the third wiring and the fifth wiring. Through the current path, a current flows from the first protective element to the second light-emitting element. The current path does not pass through one of the first wiring and the second wiring bonded to the second surface 22 of the first light-emitting element. The current path can pass through one of the first wiring and the second wiring bonded to the second surface 22 of the second light-emitting element.

Further, a current path passing through the third wiring, the fourth wiring, the fifth wiring, and the sixth wiring and not passing through the first wiring or the second wiring is formed. Through the current path, a current flows from the first protective element to the second protective element.

Modified Example 3

Figure 9:
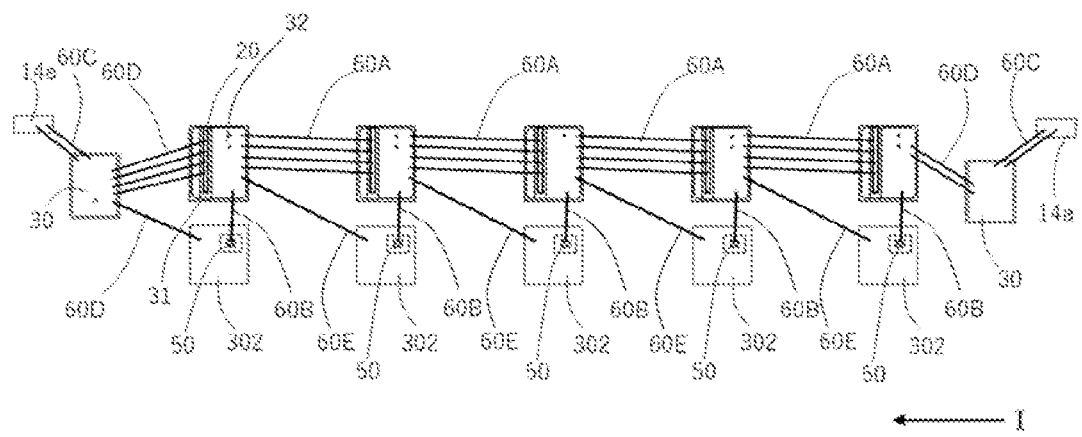
FIG. 9 is a schematic top view of a light-emitting device according to Modified Example 3 for illustrating wiring connections.

FIG. 9 is a drawing according to Modified Example 3. Modified Example 3 of the light-emitting device 1 shown in the drawing differs from the light-emitting device 1 of the first embodiment in that the protective elements 50 mounted on the support members 30 in the light-emitting device 1 of Modified Example 2 are mounted on the corresponding support members 302. The light-emitting elements 20 and the protective elements 50 are mounted on different support members in the light-emitting device 1 of Modified Example 3, so that the yield can be improved.

Differences from the light-emitting device 1 of the first embodiment are described below, but many of the differences between the Modified Example 3 and the first embodiment overlap with the differences described above between Modified Example 2 and the first embodiment. The differences overlapping with the differences in description of Modified Example 2 are obvious from comparison between Modified Example 3 shown in the drawing and the description of Modified Example 2 above, and the differences are not described again.

In Modified Example 3, one of the ends of the wiring 60B is bonded to the support member 30, and the other end is bonded to the protective element 50 mounted on the support member 302.

Modified Example 3 of the light-emitting device 1 shown in the drawing includes one or more wiring sets each including: a wiring 60B bonded to one of two adjacent support members 30, the one being on the near side of the current path, and a protective element 50 that corresponds to a light-emitting element 20 mounted on the support member 30 and is mounted on a support member 302; and one or more wirings 60E bonded to this support member 302 and the conducting region 32 of the support member 30 on the far side of the current path.

The one or more wiring sets, a wiring 60B bonded to the conducting region 32 of a support member 30 equipped with a light-emitting element 20 and the upper surface of a protective element 50 corresponding to this light-emitting element 20, and a wiring 60D bonded to a support member 302 equipped with this protective element 50 and a support member 30 not equipped with a light-emitting element 20 are disposed along the current path.

A current may flow in the reverse direction in the light-emitting device 1 of Modified Example 3. In this case, the wiring set is constituted of: a wiring 60B bonded to the conducting region 32 of one of two adjacent support members 30, the one being on the near side of the current path, and the upper surface of a protective element 50 corresponding to a light-emitting element 20 mounted on this support member 30; and one or more wirings 60E bonded to the support member 30 and a support member 302 equipped with a protective element 50 corresponding to a light-emitting element 20 mounted on the support member 30 on the far side of the current path. The one or more wiring sets, a wiring 60B bonded to the conducting region 32 of a support member 30 equipped with a light-emitting element 20 and the upper surface of a protective element 50 corresponding to this light-emitting element 20, and a wiring 60D bonded to the conducting region 32 of a support member 30 equipped with a light-emitting element 20 and a support member 30 not equipped with a light-emitting element 20 are disposed along the current path.

Modified Example 4

Figure 10:
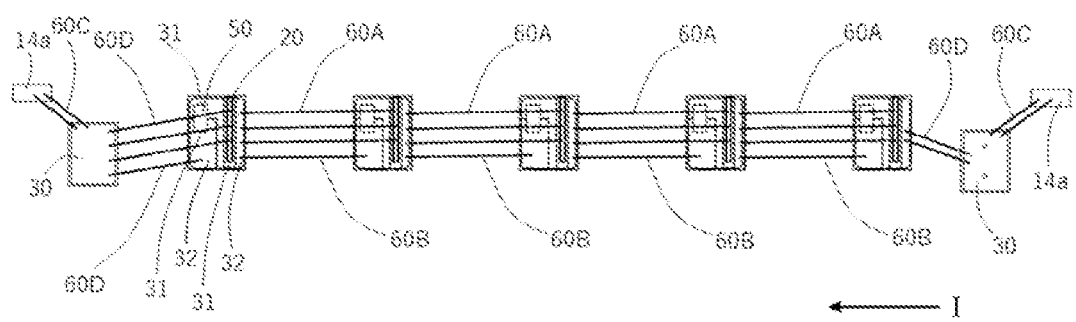
FIG. 10 is a schematic top view of a light-emitting device according to Modified Example 4 for illustrating wiring connections.

FIG. 10 is a drawing according to Modified Example 4. In Modified Example 4 of the light-emitting device 1 shown in the drawing, the protective elements 50 each include both electrodes located on the lower surface, and the electrodes are respectively bonded to two bonding regions 31 of the support member 30. This structure leads to the difference from the light-emitting device 1 of the first embodiment that the wiring 60 is not bonded to the upper surface of the protective element 50.

In Modified Example 4 of the light-emitting device 1 shown in the drawing, a plurality of wirings 60 include one or more wirings 60B each having one of the ends located inside one of two support members 30 in a top view. The other end of the wiring 60B is located inside the other support member 30 in a top view. These two support members 30 are adjacent to each other in the first direction. One of the ends of the wiring 60B is bonded to a conducting region 32 of the support member 30, the conducting region 32 being electrically connected to the bonding region 31 bonded to one of both electrodes of the protective element 50. The other end is bonded to a conducting region 32 of the support member 30, the conducting region 32 being electrically connected to the bonding region 31 bonded to the other one of both electrodes of the protective element 50.

The example of the light-emitting device 1 shown in the drawing also includes: one or more wirings 60B bonded to the conducting region 32 electrically connected to the bonding region 31 bonded to one of the electrodes of a protective element 50 mounted on one of two adjacent support members 30, the one being on the near side of the current path, and the conducting region 32 electrically connected to the bonding region 31 bonded to the other electrode of a protective element 50 mounted on the support member 30 on the far side of the current path; and a wiring 60D bonded to the conducting region 32 electrically connected to the bonding region 31 bonded to one of the electrodes of the protective element 50 and a support member 30 not equipped with a light-emitting element 20. The conducting region 32 electrically connected to the bonding region 31 bonded to the other electrode of the protective element 50 is also electrically connected to the bonding region 31 bonded to the light-emitting element 20.

A current may flow in the reverse direction in the light-emitting device 1. In this case, the conducting region 32 electrically connected to the bonding region 31 bonded to the one electrode of the protective element 50 is also electrically connected to the bonding region 31 bonded to the light-emitting element 20.

The first wiring and the second wiring included in a plurality of wirings 60 are substantially the same as in the light-emitting device 1 of the first embodiment, and the third wiring and the fourth wiring are different as described below. A plurality of wirings 60 include a third wiring. One of the ends of the third wiring is bonded to the conducting region 32 electrically connected to the bonding region 31 bonded to one of the electrodes of the first protective element. A plurality of wirings 60 include a fourth wiring. One of the ends of the fourth wiring is bonded to the conducting region 32 electrically connected to the bonding region 31 bonded to one of the electrodes of the second protective element.

Modified Example 5

Figure 11:
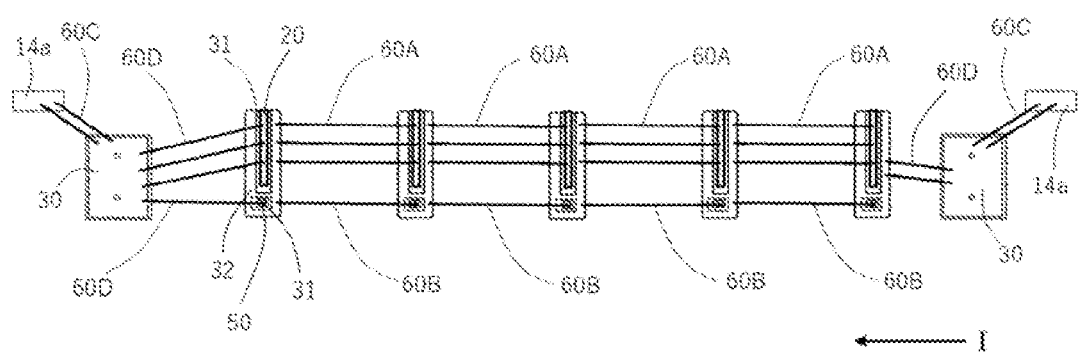
FIG. 11 is a schematic top view of a light-emitting device according to Modified Example 5 for illustrating wiring connections.

FIG. 11 is a drawing according to Modified Example 5. In Modified Example 5 of the light-emitting device 1 shown in the drawing, the protective element 50 is mounted on the support member 30 at a position farther from the light exit surface of the light-emitting element 20 mounted on the support member 30 in the second direction than a lateral surface opposite to the light exit surface. The position of the protective element 50 mounted on the support member 30 relative to the light-emitting element 20 differs from the position in the light-emitting device 1 of the first embodiment.

Disposing the protective element 50 at such a position allows the size of the support member 30 in the first direction to be reduced. The wiring 60 can be bonded such that the wiring 60 bonded to the protective element 50 does not pass directly above the light-emitting element 20.

Modified Example 6

Figure 12:
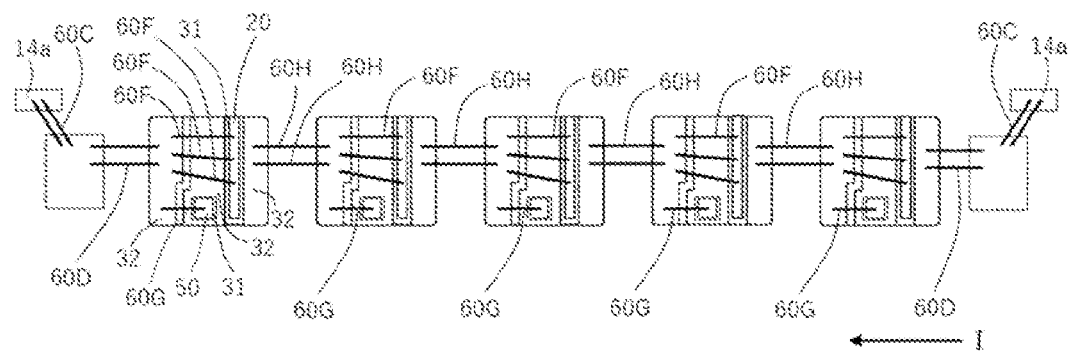
FIG. 12 is a schematic top view of a light-emitting device according to Modified Example 6 for illustrating wiring connections.

FIG. 12 is a drawing related to Modified Example 6. In Modified Example 6 of the light-emitting device 1 shown in the drawing, in the support member 30 equipped with the light-emitting element 20 and the protective element 50, a plurality of wirings 60 include one or more wirings 60F having one end bonded to the light-emitting element 20 and the other end bonded to the conducting region 32. In the support member 30 equipped with the light-emitting element 20 and the protective element 50, the plurality of wirings 60 include at least one wiring 60G having one end bonded to the protective element 50 and the other end bonded to the conducting region 32. The plurality of wirings 60 include wiring(s) 60H connecting the support members 30 adjacent to each other.

In Modified Example 6, the first wiring(s) of the wirings 60 is bonded to two support members 30, and the second wiring(s) of the wirings 60 is bonded to the support member 30 and the light-emitting element 20. Accordingly, the light-emitting element 20 and the adjacent support member 30 are electrically connected. Similarly, the first wiring(s) of the wirings 60 is bonded to two support members 30, and the second wiring(s) of the wirings 60 is bonded to the support member 30 and the protective element 50. Accordingly, the protective element 50 and the adjacent support member 30 are electrically connected.

As compared to the light-emitting device 1 of the first embodiment, in the light-emitting device 1 of Modified Example 6, the length of the wiring 60 bonded to the light-emitting element 20 and the length of the wiring 60 bonded to the protective element 50 can be shorter. Accordingly, the current load applied to the wiring 60 can be reduced.

Second Embodiment

Figure 13:
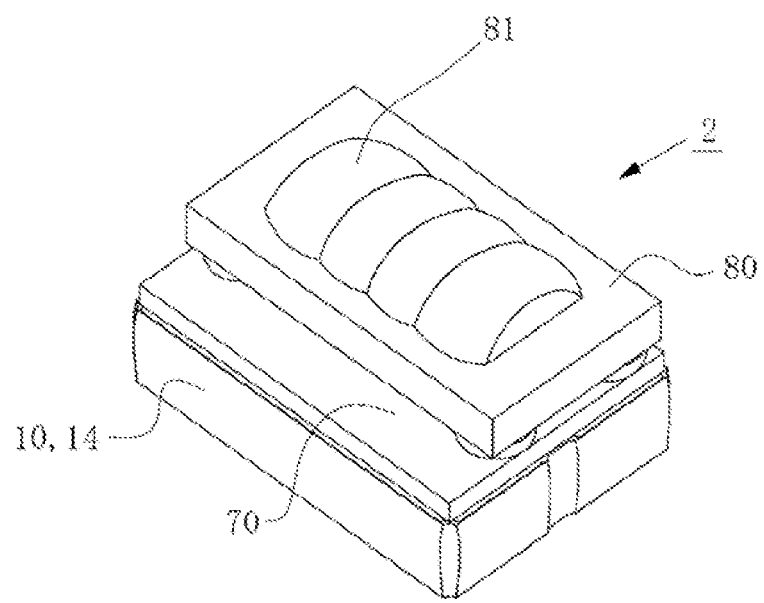
FIG. 13 is a schematic perspective view of a light-emitting device according to a second embodiment.
Figure 14:
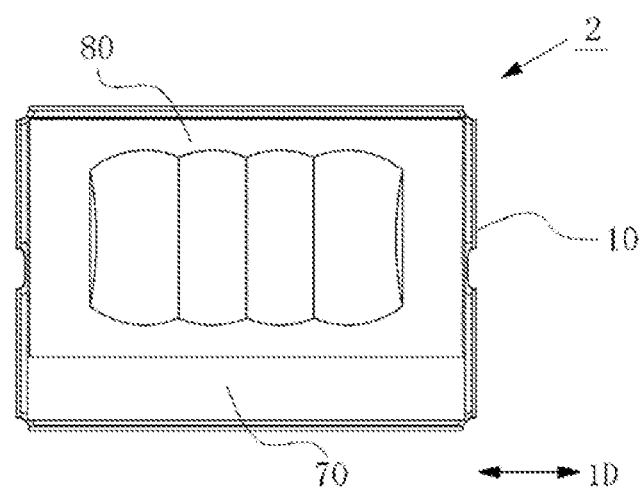
FIG. 14 is a schematic top view of the light-emitting device according to the second embodiment.
Figure 15:
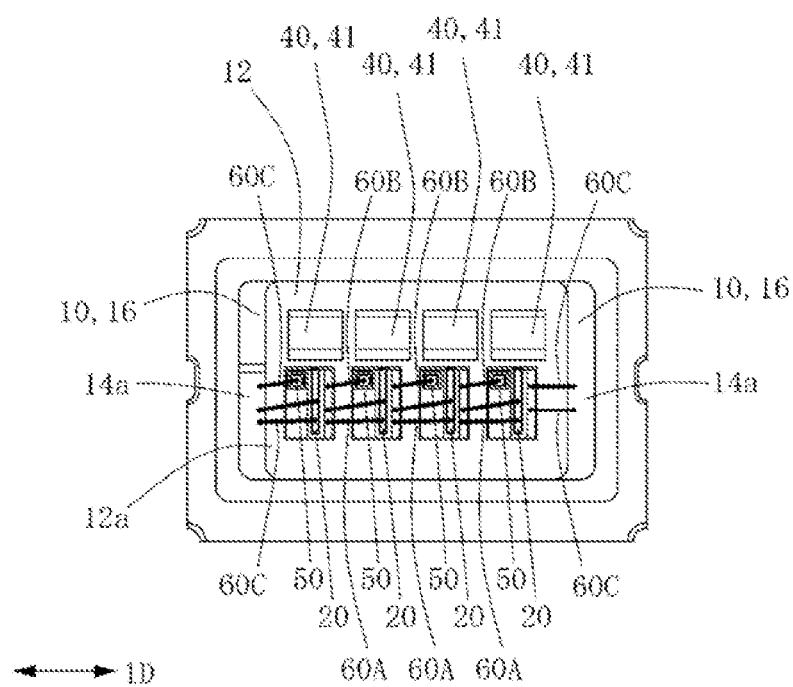
FIG. 15 is a schematic top view illustrating the internal structure of the light-emitting device according to the second embodiment.

Subsequently, a light-emitting device according to a second embodiment is described. FIG. 13 is a schematic perspective view of a light-emitting device 2, which is an example of the light-emitting device according to the second embodiment. FIG. 14 is a schematic top view of the light-emitting device 2. FIG. 15 is a schematic top view illustrating the internal structure in which some of components of the light-emitting device 2 has been removed. Descriptions overlapping with the descriptions of the light-emitting device according to the first embodiment described above may be omitted as appropriate. Features of the light-emitting device 2 shown in the drawing that are consistent with the descriptions of the first embodiment described above are applicable to the light-emitting device of the second embodiment.

The light-emitting device 2 includes a plurality of components including the base member 10, a plurality of light-emitting elements 20, a plurality of support members 30, one or more light-reflective members 40, a plurality of protective elements 50, a plurality of wirings 60, the sealing member 70, and the lens member 80. The light-emitting device 2 may further include other components.

In the light-emitting device 2, the base member 10 has one or more stepped portions 16 in the recessed portion 10a. The stepped portions 16 are portions defining the recessed shape of the base member 10. The stepped portions 16 each refer to a portion constituted of only an upper surface and an inner lateral surface intersecting with the upper surface and extending downward. The stepped portions 16 can be interpreted as portions of the lateral wall 14. The mounting surface of the base member 10 is located inside the stepped portions 16 in a top view.

In the base member 10 of the light-emitting device 2, the wiring portions 14a are disposed on the upper surfaces of the stepped portions 16. The inner wiring regions of the wiring portions 14a are disposed on the upper surfaces of the stepped portions 16. The outer wiring regions of the wiring portions 14a are disposed on the lower surface of the base member 10. The inner wiring regions and the outer wiring regions are electrically connected by via holes running through the base member 10.

In the base member 10 of the light-emitting device 2, the stepped portions 16 are formed along the inner lateral surfaces of the lateral wall 14 opposite to each other in the first direction. Further, in the base member 10 of the light-emitting device 2, no stepped portions 16 are formed along the inner lateral surfaces of the lateral wall 14 opposite to each other in the second direction.

The light-emitting device 2 does not include the support members 30 that do not equip light-emitting elements 20 and are bonded with the wirings 60. Accordingly, a plurality of wirings 60 include, instead of the wiring 60C and the wiring 60D in the first embodiment, one or more wirings 60C each bonded to the wiring portion 14a and the support member 30 equipped with the light-emitting element 20, or the light-emitting element 20 or the protective element 50 mounted on the support member 30. This structure allows for reduction in the size of the light-emitting device 2.

In the light-emitting device 2, connections of the wirings 60 are substantially the same as in description of the first embodiment except that the wiring 60C in the second embodiment replaces the wiring 60C and the wiring 60D in the first embodiment. Accordingly, as with the first embodiment, each modified example can apply to the light-emitting device according to the second embodiment.

The features below are common to the first embodiment, the second embodiment, and the modified examples of these embodiments described above.

A plurality of wirings 60 in the light-emitting device according to each embodiment include the first wiring, one of the ends of the first wiring being bonded to one of the first light-emitting element and the second light-emitting element or the support member equipped with the one light-emitting element. Further, the plurality of wirings 60 include the second wiring, one of the ends of the second wiring being bonded to one of the first light-emitting element and the second light-emitting element or the support member equipped with the one light-emitting element and the other end being bonded to the other light-emitting element or the support member equipped with the other light-emitting element. Furthermore, the plurality of wirings 60 include the third wiring and the fourth wiring. One of the ends of the third wiring is bonded to the first protective element or the support member equipped with the first protective element. One of the ends of the fourth wiring being bonded to the second protective element or the support member equipped with the second protective element.

The current path passing through the first wiring and the second wiring is formed in which a current flows from the n-electrode of the first light-emitting element to the p-electrode of the second light-emitting element. The current path passing through the third wiring is further formed in which a current flows from the first protective element to the p-electrode of the second light-emitting element. The current path passing through the third wiring and the fourth wiring and not passing through the first wiring or the second wiring is further formed in which a current flows from the first protective element to the second protective element.

Descriptions have been provided above, but the present invention having the technical feature disclosed in the specification is not limited to the structures described referring to each embodiment in the specification. For example, the present invention can apply to a light-emitting device including a component that is not disclosed in the embodiments, and the difference from the disclosed structure does not constitute grounds for inability in application of the present invention. In view of the minimum components for achieving the present invention, the components included in the light-emitting devices disclosed referring to the embodiments can include unnecessary components.

In short, the light-emitting devices disclosed referring to the embodiments in the present specification have the viewpoint of disclosure of rational constitutions based on an assumed use in addition to the viewpoint of achievement of the present invention. The application of the present invention is not limited to the illustrative use, but there is another aspect that application to that use is effective.

In the above viewpoints, it is possible that the present invention (claims) does not need to include all the components disclosed referring to one embodiment. For example, in the case in which part of the components of the light-emitting devices disclosed referring to the embodiments is not disclosed in the claims, the components are not limited to the components disclosed referring to the present embodiments. Application of the present invention disclosed in the claims is claimed while accepting design flexibility such as substitution, omission, and changes in shapes and materials made by a person skilled in the art.

The light-emitting devices and the optical members described referring to the embodiments can be used for projectors. That is, a projector is one of the uses to which the present invention applies. The present invention is not limited to this use and can be used for light sources for lightings, vehicle headlights, head-mounted displays, backlights for other displays, or the like.

The invention claimed is:

1. A light-emitting device comprising:
   a plurality of light-emitting elements each having a p-electrode and an n-electrode, the plurality of light-emitting elements including a first light-emitting element and a second light-emitting element;
   a plurality of support members including a first support member bonded with the first light-emitting element and a second support member bonded with the second light-emitting element;
   a first protective element configured to protect the first light-emitting element;
   a second protective element configured to protect the second light-emitting elements;
   a first wiring, one of ends of the first wiring being bonded to the first light-emitting element or the first support member;
   a second wiring, one of ends of the second wiring being bonded to the first light-emitting element or the first support member, and the other of the ends of the second wiring being bonded to the second light-emitting element or the second support member;
   a third wiring, one of ends of the third wiring being bonded to the first protective element or a support member equipped with the first protective element; and
   a fourth wiring, one of ends of the fourth wiring being bonded to the second protective element or a support member equipped with the second protective element, wherein
   a current passes from the n-electrode of the first light-emitting element to the p-electrode of the second light-emitting element through a first current path running through the first wiring and the second wiring,
   a current passes from the first protective element to the p-electrode of the second light-emitting element through a second current path running through the third wiring, and
   a current passes from the first protective element to the second protective element through a third current path running through the third wiring and the fourth wiring but not through the first wiring or the second wiring.

2. The light-emitting device according to claim 1, wherein the support member equipped with the first protective element is the first support member.

3. The light-emitting device according to claim 1, wherein the second wiring is bonded to the second light-emitting element.

4. The light-emitting device according to claim 1, wherein the fourth wiring is bonded to a conducting region of the first support member.

5. The light-emitting device according to claim 1, wherein the third wiring is thicker than the first wiring.

6. The light-emitting device according to claim 1, further comprising
   the plurality of light-emitting elements include three or more light-emitting elements including the first and second light-emitting elements, the three or more light-emitting elements being electrically connected in series.

7. The light-emitting device according to claim 6, wherein the three or more light-emitting elements electrically connected in series are aligned, and the first light-emitting element and the second light-emitting element are adjacent to each other.

8. The light-emitting device according to claim 7, wherein the first light-emitting element is located at an end of the three or more light-emitting elements aligned.

9. The light-emitting device according to claim 7, wherein the second light-emitting element is located at an end of the three or more light-emitting elements aligned.

10. The light-emitting device according to claim 1, wherein
    the plurality of light-emitting elements further includes a third light-emitting element,
    the second light-emitting element is adjacent to the first light-emitting element on one side, and
    the third light-emitting element is adjacent to the first light-emitting element on another side.

11. The light-emitting device according to claim 1, wherein
    the third wiring does not pass directly above the first light-emitting element.

12. The light-emitting device according to claim 1, wherein
    the first wiring does not pass directly above the first protective element, and
    the second wiring does not pass directly above the second protective element.

13. The light-emitting device according to claim 1, wherein
the first light-emitting element has a first surface and a second surface located opposite to the first surface, and the first surface serves as a light exit surface,
the first protective element is located closer to the first surface than to the second surface, and
the first wiring is bonded to the first light-emitting element at a position with a distance of 250 µm or more from the light exit surface of the first light-emitting element.

14. The light-emitting device according to claim 1, wherein
each of the first protective element and the second protective element includes a Zener diode formed of Si.

15. The light-emitting device according to claim 1, wherein
the support member equipped with the first protective element is spaced apart from the first support member.

16. The light-emitting device according to claim 1, further comprising: an additional first wiring, one of ends of the additional first wiring being bonded to the first light-emitting element or the first support member; and an additional second wiring, one of ends of the additional second wiring being bonded to the first light-emitting element or the first support member, and the other of the ends of the additional second wiring being bonded to the second light-emitting element or the second support member.

17. A light-emitting device comprising:
a plurality of light-emitting elements each having a first surface and a second surface opposite to the first surface, the plurality of light-emitting elements including a first light-emitting element and a second light-emitting element;
a plurality of support members including a first support member bonded with the first surface of the first light-emitting element and a second support member bonded with the first surface of the second light-emitting element;
a first protective element configured to protect the first light-emitting element;
a second protective element configured to protect the second light-emitting element;
a first wiring, one of ends of the first wiring being bonded to the second surface of the first light-emitting element;
a second wiring, one of ends of the second wiring being bonded to the support member equipped with the first light-emitting element, and the other of the ends of the second wiring being bonded to the second surface of the second light-emitting element or the second support member;
a third wiring, one of ends of the third wiring being bonded to the first protective element; and
a fourth wiring, one of ends of the fourth wiring being bonded to the second protective element, wherein
a current passes from the first light-emitting element to the second light-emitting element through a first current path running through the first wiring and the second wiring but not through the third wiring or the fourth wiring,
a current passes from the first protective element to the second light-emitting element through a second current path running through the third wiring but not the first wiring, and
a current passes from the first protective element to the second protective element through a third current path running through the third wiring and the fourth wiring but not through the first wiring or the second wiring.

\* \* \* \* \*